(12) United States Patent
Linliu et al.

(10) Patent No.: US 6,479,401 B1
(45) Date of Patent: Nov. 12, 2002

(54) METHOD OF FORMING A DUAL-LAYER ANTI-REFLECTIVE COATING

(75) Inventors: Kung Linliu, Hsinchu (TW); Mai-Ru Kuo, Hsinchu (TW)

(73) Assignee: Worldwide Semiconductor Manufacturing Corp. (TW)

( * ) Notice: Subject to any disclaimer, the term of this patent is extended or adjusted under 35 U.S.C. 154(b) by 0 days.

(21) Appl. No.: 09/451,853

(22) Filed: Dec. 1, 1999

(51) Int. Cl.[7] ............................................. H01L 21/312
(52) U.S. Cl. ........................ 438/763; 438/636; 438/952
(58) Field of Search ................................. 438/669, 763, 438/952, FOR 405, FOR 395, 636, 780; 427/99, 409

(56) References Cited

U.S. PATENT DOCUMENTS 5,980,768 A * 11/1999 Abraham
6,214,637 B1 * 4/2001 Kim et al.
6,218,292 B1 * 4/2001 Foote
2002/0016078 A1 * 2/2002 Ionov et al. ................. 438/710

OTHER PUBLICATIONS

Ghandhi, S., "VLSI Fabrication Principles", John Wiley and Sons, pp. 629–633, 1994.*
(1) Y. Suda et al., "A New Anti-reflective Layer for Deep UV Lithography", SPIE vol. 1674, Optical/Laser Microlithography V, 1992, pp. 350–361.

* cited by examiner

Primary Examiner—George Fourson

(57) ABSTRACT

A method of forming an anti-reflective coating is described. A film is formed on a substrate. A first layer of an anti-reflective coating layer Is deposited on the film by chemical vapor deposition using a canrier gas, an organic halide gas and a hydrogen halide gas as gas sources. A second layer of the anti-reflective coating layer is formed on the first layer of the anti-reflective coating layer by chemical vapor deposition using a carrier gas and an organic halide gas as gas sources. A photoresist layer is formed on the second layer of the anti-reflective coating layer.

10 Claims, 1 Drawing Sheet

METHOD OF FORMING A DUAL-LAYER ANTI-REFLECTIVE COATING

FIELD OF THE INVENTION

The present invention generally relates to a method of forming a dual-layer anti-reflective coating, and more particularly to form a scum-free anti-reflective coating.

BACKGROUND OF THE RELATED ART

Microcircuit fabrication requires that precisely controlled quantities of impurities be introduced into tiny regions of the silicon substrate, and subsequently these regions must be interconnected to create components and VLSI circuits. The patterns that define such regions are created by lithographic process. As semiconductor devices become more highly integrated, the line width of VLSI circuits is typically scaled down. The semiconductor industry's drive toward integrated circuits with ever-decreasing geometry, coupled with its pervasive use of highly reflective materials, such as polysilicon, aluminum, and metal silicides, has led to an increase in photolithography-patterning problems. Unexpected reflections from these underlying materials, during the photoresist pattering step, result in the photoresist pattern being distorted. This problem is further compounded when the photolithographic process employs a light source in the ultraviolet (UV) or deep ultraviolet (DUV) ranges. The resulting patterns generated in the photoresist are easily compromised by the effects of uncontrolled reflections from the underlying materials due to the increased optical metallic nature of underlying reflective materials at these wavelengths. Therefore, the fabrication of advanced integrated circuits with submicron geometry is limited.

Hence, an anti-reflective coating (ARC) is needed to solve these problems. However, the effects of the anti-reflective coating are affected by some parameters. The thickness and optical characters of the anti-reflective coating are the major factors that influence the effects. The optical characteristics of the anti-reflective coating include the refractive index (n) and extinction coefficient (k). Further, the thickness and optical characteristics of the anti-reflective coating are affected by materials and recipes used to form the anti-reflective coating.

In order to overcome the disadvantages described above, inorganic anti-reflection material, mainly consisting of silicon oxynitride ($SiO_xN_y$), are naturally applied for lithographic application, especially in the deep ultraviolet (DUV) wavelength range. Steps of fabricating silicon oxynitride layer include injection of a preferable gas such as $SiH_4$ and $N_2O$, and controlling the injection rate. Further, plasma is introduced to enhance the formation rate of the silicon oxynitride layer. Nevertheless, a wet etching process is necessary for removing inorganic ARC from a substrate. Furthermore, the silicon oxynitride layer is unlikely to be formed on an organic layer. An example of the prior arts can be found in SPIE Vol. 1674 Optical/Laser Microlithography V, 1992, pp. 350–361, in which Yurika Suda et al. published a paper entitled, "A New Anti-reflective Layer for Deep UV Lithography". In this paper, an anti-reflective layer (ARL), i.e. an anti-reflective coating, is used for sub-half-micron and quarter-micron KrF excimer laser lithography and has advantages including improved critical dimension (C.D.) control with the photoresist thickness and reduction of notching caused by reflection from the substrate. An a-C:H ARL is underneath the photoresist, and the most suitable film conditions are determined by experimentation. Besides, the a-C:H ARL is organic and can be simultaneously removed with the photoresist. Also, since the exposure and focus latitudes are high, the new scheme is promising for single-layer photoresist processing with KrF excimer laser lithography. However, the organic ARC is not good for later etching, which is due to the varying thickness of the organic ARC resulting from its planar surface.

There are still other issues that need to be solved. For example, some chemical compositions of the ARC will interact with photoresist or the layers under the ARC. This results in scum at the edge of patterned pattern. The critical dimension (C.D.) will be lost because of the scum.

Therefore, what is needed is a novel material for serving as the ARC, which is conformal and can be easily removed from substrates by using conventional dry etching process. Moreover, the optical characters of the ARC are preferably tunable and the material of the ARC is preferably stable with the photoresist thereon or the films thereunder.

SUMMARY OF THE INVENTION

The present invention provides a method of forming a dual-layer of anti-reflective coating.

Another object of the present invention is to provide a method of forming the anti-reflective coating with tunable refractive index (n) and exaction coefficient (k).

A further object of the present invention is to provide a method of forming the anti-reflective coating with good conformity.

First, a thin film layer is formed on the substrate, an anti-reflective coating layer is formed on the thin film layer and a photoresist layer is formed on the anti-reflective coating layer. The anti-reflective coating layer is composed of the first layer with a thickness of about 100 to 1000 angstroms and second layer with a thickness of about 100 to 1000 angstroms. The recipe of the first layer includes organic halide ($C_xH_yX_z$), hydrogen halide (HX), and carrier gas. The refractive index (n) of the first layer is about 1.5 to 2.6 and the extinction coefficient (k) is about 0.1 to 0.9. The recipe of the second layer includes organic halide ($C_xH_yX_z$) and carrier gas. The refractive index (n) of the second layer is about 1.1 to 2.0 and the extinction coefficient (k) is about 0.01 to 0.5. Next, the photoresist layer is processed by photolithography and the anti-reflective coating layer and thin film layer are anisotropically etched while using the patterned photoresist layer as a mask. Finally, the photoresist layer and the anti-reflective coating are removed by using a conventional dry etching process.

BRIEF DESCRIPTION OF THE DRAWINGS

The objects, features and advantages of the present invention will be apparent from the following more precise description of the invention illustrated in the accompanying drawings, in which.

DETAILED DESCRIPTION OF THE PREFERRED EMBODIMENT

In the present invention, a method of forming an anti-reflective coating in a process chamber is disclosed. The main point in the present invention is to form a dual-layer anti-reflective coating.

Figure 1:
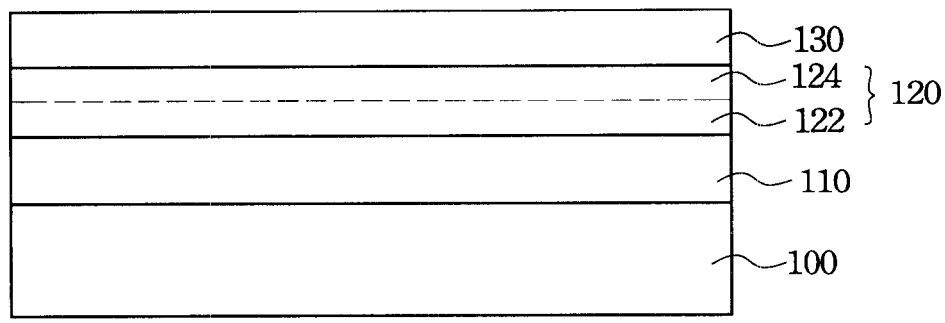
FIG. 1 shows a cross sectional view of a semiconductor substrate illustrating the steps of forming a thin film layer, an anti-reflective coating and a photoresist layer according to the present invention.

Referring to FIG. 1, a single crystal substrate 100 with a <100> crystallographic orientation is used for a preferred embodiment. A thin film layer 110 is formed on the substrate 100, and the thin film layer 110 will be patterned in subsequent processes. The material of the thin film layer 110 is polysilicon, oxide, metal or tungsten silicide. Then, an anti-reflective coating layer 120 is formed on the thin film layer 110 by chemical vapor deposition (CVD). Finally, a photoresist layer 130 is formed on the anti-reflective coating layer 120. Because the anti-reflective coating (ARC) layer 120 is beneath the photoresist layer 130, the anti-reflective coating layer 120 is also called a bottom anti-reflective coating (BARC) layer. The anti-reflective coating layer 120 reduces the reflective illumination from the thin film layer 110 and the substrate 100 during the photolithography process for forming patterns on the photoresist layer 130. It makes the patterns formed on the photoresist layer 130 have sharp shapes and the critical dimension of patterns on the thin film layer 110 can be controlled very well.

The anti-reflective coating layer 120 in the present invention is composed of dual layers. The anti-reflective coating layer 120 is composed of a first layer 122 with a thickness of about 100 to 1000 angstroms and a second layer 124 with a thickness of about 100 to 1000 angstroms. The recipe for forming the first layer 122 includes organic halide ($C_xH_yX_z$), hydrogen halide (HX), and carrier gas. The flow rate of hydrogen halide, such as hydrogen bromide, hydrogen fluoride or hydrogen chloride, is about 1 to 200 sccm. The flow rate of the organic halide ($C_xH_yX_z$), such as $CH_2F_2$, $CHF_3$, $CH_3F$, $C_2F_6$, $C_2HF_5$, $C_4F_8$, is about 1 to 200 sccm. The x number of the carbon element is about 1 to 6, the y number of the hydrogen element is about 0 to 10 and the z number of the halide element is about 0 to 10. The reaction gases of the organic halide ($C_xH_yX_z$) and the hydrogen halide (HX) are injected into the process chamber by a carrier gas. In this case, plasma is induced by a power supply to enhance the reaction rate of the first layer 122.

Furthermore, the ratio of the hydrogen halide and organic halide in the recipe influence the optical characters of the ARC. The refractive index (n) is about 1.5 to 2.5 and the extinction coefficient (k) is about 0.1 to 0.8, if the flow rate of the hydrogen halide is about 1 to 300 sccm and the organic halide is about 1 to 300 sccm. The optical characters of the ARC are changed by varying the ratio of the hydrogen halide (HX) and the organic halide ($C_xH_yX_z$). Therefore, the refractive index (n) and extinction coefficient (k) of the ARC are parameters adjustable by controlling the flow rate of the hydrogen halide (HX) and organic halide ($C_xH_yX_z$).

The recipe of the second layer 124 includes organic halide ($C_xH_yX_z$) and carrier gas. The flow rate of the organic halide is about 1 to 200 sccm. The x number of the carbon element, the y number of the hydrogen element and z number of the halide element are about 1 to 6, 0 to 10 and 0 to 10, respectively. The reaction gases of organic halide ($C_xH_yX_z$), such as $CH_2F_2$, $CHF_3$, $CH_3F$, $C_2F_6$, $C_2HF_5$, $C_4F_8$, are injected into a process chamber by a carrier gas. The refractive index is about 1.1 to 2.0 and the extinction coefficient is about 0.01 to 0.5. The n and k of the second layer 124 of the ARC 120 are parameters adjustable by controlling the flow rate of the organic halide.

Figure 2:
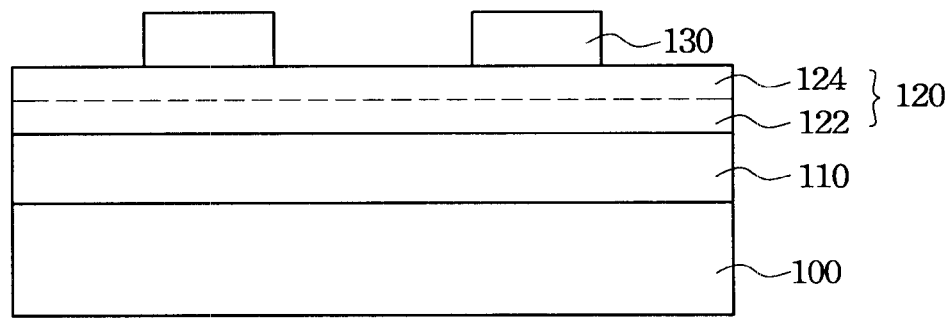
FIG. 2 is a cross sectional view of a semiconductor substrate illustrating the step of photolithography according to the present invention.
Figure 3:
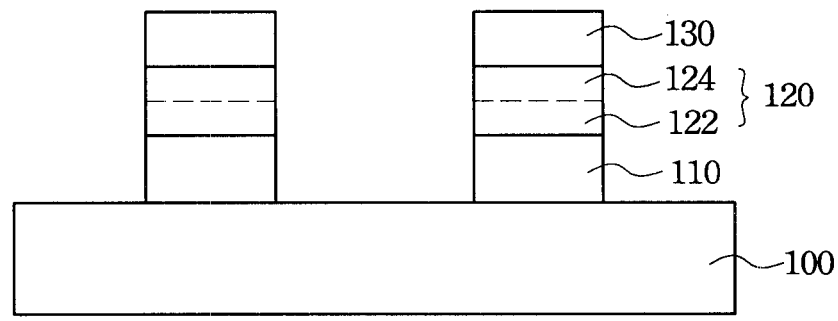
FIG. 3 is a cross sectional view of a semiconductor substrate illustrating the step of etching the anti-reflective coating and thin film layer in accordance with the present invention.
Figure 4:
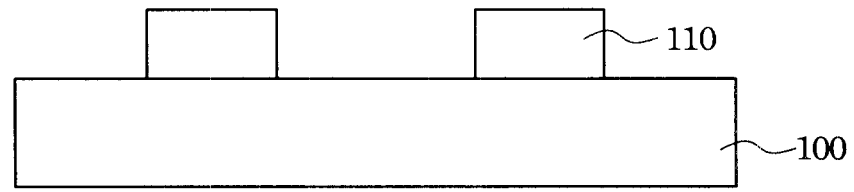
FIG. 4 is a cross sectional view of a semiconductor substrate illustrating the step of removing the anti-reflective coating and the photoresist layer in accordance with the present invention.

Referring to FIG. 2, the substrate 100 is processed by photolithography to form patterns on the photoresist layer 130. Referring to FIG. 3, the anti-reflective coating layer 120 and the thin film layer 110 are anisotropically etched while using the patterned photoresist layer as a mask. Referring to FIG. 4, the photoresist layer 130 and the anti-reflective coating 120 are removed by plasma.

According to the present invention, the dual-layer anti-reflective coating has at least the following characteristics. (1) The refractive index (n) and extinction coefficient (k) of the anti-reflective coating are tunable by adjusting the flow rate of the reaction gases. (2) The anti-reflective coating can be easily removed by plasma, like the traditional organic ARC. (3) The anti-reflective coating in the present invention has good conformity with a film uniformity less than 5%. (4) The formation rate of the anti-reflective coating can be adjusted to as low as 4.3 Å/sec. (5) The dual-layer structure of the anti-reflective coating can eliminate any chemical reaction between the bromide-containing composition of the ARC and photoresist layer thereon.

A person skilled in the art will be able to modify the dual-layer anti-reflective layer to a multiple-layer ARC by utilizing the spirit in the present invention as a basis. The multiple-layer ARC can be formed with the help of process simulation by using a computer software such as PROLITH. The multiple-layer ARC not only eliminates any chemical reaction between bromide-containing composition of the ARC and photoresist layer thereon, but also eliminates any chemical reaction between bromide-containing composition of the ARC and thin film layer thereunder, if the thin film layer interacts with the bromide-containing ARC.

While the invention has been described in terms of a single preferred embodiment, various alternatives and modifications can be devised by those skilled in the art without departing from the invention. Accordingly, the present invention is intended to embrace all such alternatives that fall within the scope of the appended claims.

The embodiments of the invention in which an exclusive property or privilege is claimed are defined as follows:

1. A method of forming an anti-reflective coating layer, the method comprising:

providing a substrate with a film formed thereon;

forming a first layer of an anti-reflective coating layer on the film by chemical vapor deposition, wherein a carrier gas, an organic halide gas and a hydrogen halide gas are introduced into a process chamber during the chemical vapor deposition, wherein the organic halide gas is an alkyl halide having a general chemical formula of $C_xH_yX_z$, and the x number, the y number and the z number are respectively about 1 to 6, about 0 to 10 and about 0 to 10, and the hydrogen halide gas is selected from a group consisting of HF, HCl, and HBr;

forming a second layer of the anti-reflective coating layer on the first layer of the anti-reflective coating layer by chemical vapor deposition, wherein the carrier gas and the organic halide gas are introduced into the process chamber during the chemical vapor deposition; and forming a photoresist layer on the second layer of the anti-reflective coating layer for photolithography.

2. The method according to claim 1, wherein the organic halide gas is selected from the group consisting of $CHF_3$, $CH_3F$, $CH_2F_2$, $C_2F_6$, $C_2HF_5$, $C_4F_8$, and a combination thereof.

3. The method according to claim 1, wherein the first layer of the anti-reflective coating layer has a thickness of about 100 to 1000 angstroms.

4. The method according to claim 1, wherein the second layer of the anti-reflective coating layer has a thickness of about 100 to 1000 angstroms.

5. The method according to claim 1, wherein the first layer of the anti-reflective coating layer has a refractive index (n) of about 1.5 to 2.5 and an extinction coefficient (k) of about 0.1 to 0.8.

6. The method according to claim 1, wherein the second layer of the anti-reflective coating layer has a refractive index (n) of about 1.1 to 2.0 and an extinction coefficient (k) of about 0.01 to 0.5.

7. A method of forming an anti-reflective coating layer, the method comprising:

providing a substrate with a film formed thereon;

forming a first layer of an anti-reflective coating layer on the film by chemical vapor deposition by introducing a carrier gas, an organic halide gas and a hydrogen halide gas into a process chamber during the chemical vapor deposition, wherein the hydrogen halide gas is selected from a group consisting of HF, HCl and HBr, the organic halide gas is an alkyl halide having a general chemical formula of $C_xH_yX_z$, and the x number, the y number and the z number are respectively about 1 to 6, about 0 to 10 and about 0 to 10, and a refractive index (n) and an extinction coefficient (k) of the first layer of the anti-reflective coating layer are respectively about 1.5 to 2.5 and about 0.1 to 0.8;

forming a second layer of the anti-reflective coating layer on the first layer of the anti-reflective coating layer by chemical vapor deposition, wherein the carrier gas and the organic halide gas are introduced into the process chamber during the chemical vapor deposition, and a refractive index (n) and an extinction coefficient (k) of the second layer of the anti-reflective coating layer being respectively about 1.1 to 2.0 and about 0.01 to 0.5; and forming a photoresist layer on the second layer of the anti-reflective coating layer for photolithography.

8. The method according to claim 7, wherein the organic halide gas is selected from the group consisting of $CHF_3$, $CH_3F$, $CH_2F_2$, $C_2F_6$, $C_2HF_5$, $C_4F_8$, and a combination thereof.

9. The method according to claim 7, wherein the first layer of the anti-reflective coating layer has a thickness of about 100 to 1000 angstroms.

10. The method according to claim 7, wherein the second layer of the anti-reflective coating layer has a thickness of about 100 to 1000 angstroms.

* * * * *